United States Patent [19]
Liu et al.

[11] Patent Number: 5,396,467
[45] Date of Patent: Mar. 7, 1995

[54] SENSE AMPLIFIER

[75] Inventors: Ding-Jen Liu; Jyh-Jer Cho, both of Hsinchu, Taiwan, Prov. of China

[73] Assignee: United Microelectronics Corp., Taiwan, Prov. of China

[21] Appl. No.: 220,248

[22] Filed: Mar. 30, 1994

[51] Int. Cl.$^6$ .............................................. G11C 7/00
[52] U.S. Cl. ................. 365/210; 365/189.07; 365/233.5
[58] Field of Search ............... 365/189.01, 207, 208, 365/210, 189.07, 233.5

[56] References Cited

U.S. PATENT DOCUMENTS

| | | | |
|---|---|---|---|
| 4,974,207 | 11/1990 | Hashimoto | 365/210 |
| 5,191,552 | 3/1993 | Nakai et al. | 365/210 X |
| 5,197,028 | 3/1993 | Nakai | 365/185 |
| 5,301,149 | 4/1994 | Jinbo | 365/210 X |
| 5,305,273 | 4/1994 | Jinbo | 365/210 |

*Primary Examiner*—Eugene R. LaRoche
*Assistant Examiner*—Son Dinh
*Attorney, Agent, or Firm*—Knobbe, Martens, Olson & Bear

[57] ABSTRACT

A two-phase sense amplifier includes a data sensing circuitry including a presetting current detecting circuit for allowing the sense amplifier to be in a presetting phase when an X-decoder decodes an address of a selected word line of a selected memory cell and a Y-decoder decodes an address of a selected bit line of the selected memory cell and then for setting a voltage level of the selected bit line to be around a switching point and an evaluating current detecting circuit for allowing the sense amplifier to be in an evaluating phase after the voltage level of the selected bit line is around the switching point in order to sense a current in the selected cell for converting the current into a voltage output, a dummy cell circuitry electrically connected to the data sensing circuitry for providing a reference voltage to the data sensing circuitry, and a differential amplifier electrically connected to the data sensing circuitry and the dummy cell circuitry for accepting and comparing the voltage output and the reference voltage to sense data of the selected memory cell. Such a sense amplifier can have a relatively high sensing speed.

27 Claims, 5 Drawing Sheets

SENSE AMPLIFIER

FIELD OF THE INVENTION

The present invention relates generally to a sense amplifier, and more particularly to a two-phase sense amplifier used for a nonvolatile memory such as a ROM, EPROM, or EEPROM.

BACKGROUND OF THE INVENTION

As shown in FIG. 1, the conventional sense amplifier includes a data sensing circuitry 01, a dummy cell circuitry 02 and a differential amplifier 03. The data sensing circuitry 01 is a current detector; and the dummy cell circuitry 02 includes a dummy cell 021, a dummy multiplexer (YMUX) 022 and a current-voltage converting circuitry 023. More detailedly, the current detector 013 includes a NOR gate 0131, an NMOS 0132 and a PMOS 0133 providing a load effect, and the current-voltage convening circuitry 023 includes a NOR gate 0321, an NMOS 0232, and two PMOS 0233, 0234 providing a load effect, wherein the PMOS 0233, 0324 and the PMOS 0133 are identical in size.

The output node OP-SA of the data sensing circuitry 01 and the output node OP-DM of the dummy cell circuitry 02 are respectively electrically connected to two inputs 031, 032 of the amplifier 03 for comparing the output results in the outputs OP-SA and OP-DM to sense the data of selected cell in a memory array 011.

The memory array 011 includes plural memory cells kn ... km ... ln ... lm etc., wherein the lines connect the drains of the vertical memory cells are bit lines BL-n ... BL-m, and the lines connect the gates of the horizontal memory cells are word lines WL-k ... WL-1. The bit lines BL-n, BL-m of the memory array 011 are electrically connected to a YMUX 012. One terminal of the transmission gate MUX-n (or MUX-m) of the YMUX 012 is electrically connected to the bit line BL-n (or BL-m) while the other terminal is electrically connected to the NMOS 0132 of the current detector 013.

When one memory cell of the memory array 011 (called the selected cell), e.g. the memory cell km, is to be read, an X-decoder and a Y-decoder (not shown) will execute a decoding function for obtaining an address of the memory cell km, and then enable word line WL-k and bit line BL-m. Now, the word line WL-k is called selected WL and the bit line BL-m is called selected BL. Thus, the output YSEL-m of the Y-decoder allows the corresponding transmission gate MUX-m of the YMUX 012 to be on in order that the data of the selected cell km can be sensed by the conventional sense amplifier through the bit line BL-m.

The dummy cell circuitry 02 is used for providing a reference voltage. When the input EN2 of the NOR gate 0231 is enabled, the dummy cell circuitry functions. If the gate of the dummy cell 021 is connected to VCC and the dummy cell 021 is biased with an operating point near to that of the selected cell kin, so the current of the dummy cell 021 and the current of the selected cell km which is allowed to be on are very close. The current of the dummy cell 012 is transmitted into the current-voltage converting circuit 023 through dummy YMUX 022, and there is the reference voltage, generated at the output OP-DM, which will then be transmitted into the input 031 of the differential amplifier 03.

When sensing the data in the selected cell km, we must maintain the bit line BL-m at a voltage near to the switching point, regardless of whether the selected cell km is an on cell or an off cell. Depending on whether the cell is on or off, the output OP-SA of detector 013 will have a small voltage swing. Then, the voltage at the output OP-SA is input to the input 032 of the differential amplifier 03 to be compared with the voltage at the output OP-DM in order that differential amplifier 03 can fast sense the data of the on cell or the off cell. It is to be noticed that the so-called switching point means the voltage at the bit line BL-m, when the voltage at the output node OP-DM equals to the voltage at the output node OP-DM. When the selected cell km is an on cell (having a low threshold voltage Vtn), there is a larger current flowing through current detector 013, the transmission gate MUX-m, and the selected cell km to the ground GND. Under a stable situation, the current flowing through the current detector 013 equals to the current flowing through the selected cell km and the value of this current is defined as Icell. When the selected cell km is an off cell (having a high threshold voltage Vtn), there is no or only a very small current flowing through said path.

When the input ENI of the NOR gate 0131 is enabled, the data sensing circuitry 01 begins to work. If the selected cell km is an off cell and the selected bit line BL-m has the lowest voltage, i.e. right at the beginning of being accessible, there is a current flowing from the Vcc of the PMOS 0133 and charging the equivalent capacitor of the selected bit line BL-m through NMOS 0132. Thus, the voltage of the bit line BL-m is higher and higher, and the NMOS is gradually cut-off. When the bit line BL-m is charged to have a voltage slightly higher than the switching point and the current through the current detector 013 is slightly smaller than one half of Icell, the voltage at the output node OP-SA is then higher than the voltage at the output node OP-DM, thus the differential amplifier 03 can correctly sense the data in the off cell. On the contrary, when the selected cell km is an on cell, the equivalent capacitor of the bit line BL-m will be discharged by the on cell with respect to the ground. Thus, the voltage at the bit line BL-m is lower and lower and the NMOS 0132 is turned on more and more. When the bit line BL-m is charged up to have a voltage slightly higher than the switching point and the current through the current detector 013 is larger than one half of Icell, the voltage at the output OP-SA is lower than the voltage at the output OP-DM, and then the differential amplifier 03 can correctly sense the data in the on cell.

There are three latent issues suffered by the conventional sense amplifier which are described as follows:

1) For obtaining a larger input voltage difference (i.e., larger than 0.4 V), the conventional sense amplifier usually applies the load device (i.e., PMOS 0133) with a relatively higher impedance (which is higher than that of the on cell). Therefore, when the off cell is to be sensed, the bit line BL-m cannot obtain a larger charging current (especially when the selected bit line has an initial grounded voltage), and thus the sensing speed is lowered.

2) If the conventional sense amplifier were designed to have a better noise immunity, the bit line (of the on cell or the off cell) should be kept at a marginal voltage with a certain amount from the switching point (usually for above about 100 mV). Because if their difference is too small, although the data in the cell can be fast sensed, the noise in GND or Vcc will result in an unstable bit line voltage which in turn results in an unstable output of current detector 013. Thus, the marginal voltage is normally designed to be somewhat distant form the switching point. In the case of WL-switching access, the previous selected cell and the present selected cell are to have the same bit line but the different word lines, and there is a relatively long delay time of the word line when an off cell is switched into an on cell, even if the data are sensed, the on cell is not completely turned on so that the equivalent current for charging (or discharging) the selected bit line is smaller than Icell. Thus, the conventional sense amplifier must take a relatively long period of time for allowing the bit line to be charged (or discharged) from the marginal voltage to the switching point.

3) When the NOR gate 0131 of the current detector 013 functions, whose trip voltage will vary with the noise-disturbed positive supply voltage Vcc and negative supply voltage Vss (not shown). When every selected cell is off, the voltage of the selected bit line will increase with the increase of the trip voltage.

When the trip voltage drops with the drop of the Vcc or the noise, but while there is no discharge path allowing the voltage of the selected bit line to drop, there are extra charges trapped in the selected bite line. Therefore, after the switch of the word line to the next selected on cell, it must take a relatively long period of time to discharge the extra charges to drop the voltage of the selected bit line below the switching point and thus the required sensing time is prolonged. Generally speaking, the noise signal can be over about 0.5 V, and the variation of the trip voltage can be over about 0.2 V so that for some short-time sensing applications, it is possible that before the sensing cycle ends, the extra bit line charges still cannot be discharged, and therefore the sensing errors are generated.

It is therefore attempted by the Applicant to deal with the above situation encountered by the prior art.

SUMMARY OF THE INVENTION

One objective of the present invention is to provide a high speed two-phase sense amplifier.

In accordance with one aspect of the present invention, a two-phase sense amplifier is used to sense the data of a memory array which includes plural memory cells wherein drains of the memory cells in a column are electrically connected to a bit line and gates of the memory cells in a row are electrically connected to a word line, and wherein the memory array is electrically connected to an X-decoder and a Y-decoder which are utilized to select one of the memory cells in the memory array. The two-phase sense amplifier includes a data sensing circuitry, a dummy cell circuitry and a differential sense amplifier. The data sensing circuitry includes a presetting current detecting circuit for allowing the sense amplifier to be in a presetting phase when the X-decoder decodes an address of a selected word line of the selected memory cell and the Y-decoder decodes an address of a selected bit line of the selected memory cell and then for gradually setting a voltage level of the selected bit line to be around a switching point and an evaluating current detecting circuit for allowing the sense amplifier to be in an evaluating phase after the voltage level of the selected bit line has been preset around the switching point in order to sense a current in the selected cell and convert the current into a voltage output. The dummy cell circuitry is used to provide a reference voltage to the data sensing circuitry. The differential amplifier electrically connected to the data sensing circuitry and the dummy cell circuitry is used to accept and compare the voltage output of the data sensing circuitry and the reference voltage of the dummy cell circuitry for sensing data of the selected memory cell.

Certainly, the dummy cell circuitry can include a dummy YMUX, a dummy cell electrically connected to the dummy YMUX wherein the dummy cell is biased at an operating point near to that of the selected cell in order to make sure that the dummy cell current and the current of the selected "on" cell are almost the same, and a current-voltage converting circuit electrically connected to the differential amplifier and the evaluating current detecting circuit for converting the dummy cell current into the reference voltage.

Certainly, the current-voltage converting circuitry can include a third inverting device for enabling the dummy cell circuitry and for providing an amplifying effect, a third current switch electrically connected to and controlled by the third inverting device, and a second load device electrically connected to the third inverting device for converting the dummy cell current into the reference voltage. Certainly, the third inverting device can be a NOR gate, the third current switch can be an NMOS, and the second load device can include two PMOS.

Certainly, the presetting current detecting circuit can include a first inverting device for accepting a low $\overline{PRESET}$ signal to enable the sense amplifier in the presetting phase and to provide an amplifying effect, and a first current switch electrically connected to and controlled by the first inverting device. The first inverting device can be a NOR gate, and the first current switch can be an NMOS. Certainly, the evaluating current detecting circuit can further include a NOT gate electrically connected to the first inverting device and a bleed device electrically connected to the first current switch for providing a discharging path to ground the charges trapped in the selected bit line. The bleed device can be an NMOS. The bleed device can have a size from about two times to about five times that of any one of the memory cells.

Certainly, the presetting current detecting circuit can further include a compensating capacitor electrically connected to the first inverting device for compensating a clock feed-through effect thereof in order to maintain the voltage level of the selected bit line to be around the switching point just before and after the onset of the evaluating phase. The compensating capacitor can be a PMOS or an NMOS capacitor.

Certainly, the presetting current detecting circuit can further include a delay device electrically connected to the first inverting device and an equalizing device electrically connected to the delay device for maintaining the voltage output and the reference voltage to be equal for a certain period of time after the presetting phase is over. The equalizing device can be a CMOS, a PMOS or an NMOS transmission gate.

Certainly, the evaluating current detecting circuit can include a second inverting device for accepting a low $\overline{EVAL}$ signal to enable the sense amplifier to be in the evaluating phase and to provide an amplifying effect, a second current switch electrically connected to and controlled by the second inverting device, and a first load device electrically connected to the second inverting device for sensing the voltage output according to the current in the selected cell. The second inverting device can be a NOR gate.

Certainly, the first, second and third inverting devices can have relatively close sizes. The first and second inverting devices can have approximately the same voltage gain. The second and third current switches can have relatively close sizes. The second inverting device can have a trip voltage ranging from about 1.2 V to about 1.5 V. The first and second load devices can have exactly the same device size. The switching point can mean a voltage value of the selected bit line when the voltage output of the data sensing circuitry equals to the reference voltage of the dummy cell circuitry.

The present invention can be more fully understood by reference to the following description and accompanying drawings, which form an integral part of this application.

DETAILED DESCRIPTION OF THE PREFERRED EMBODIMENT

Figure 2:
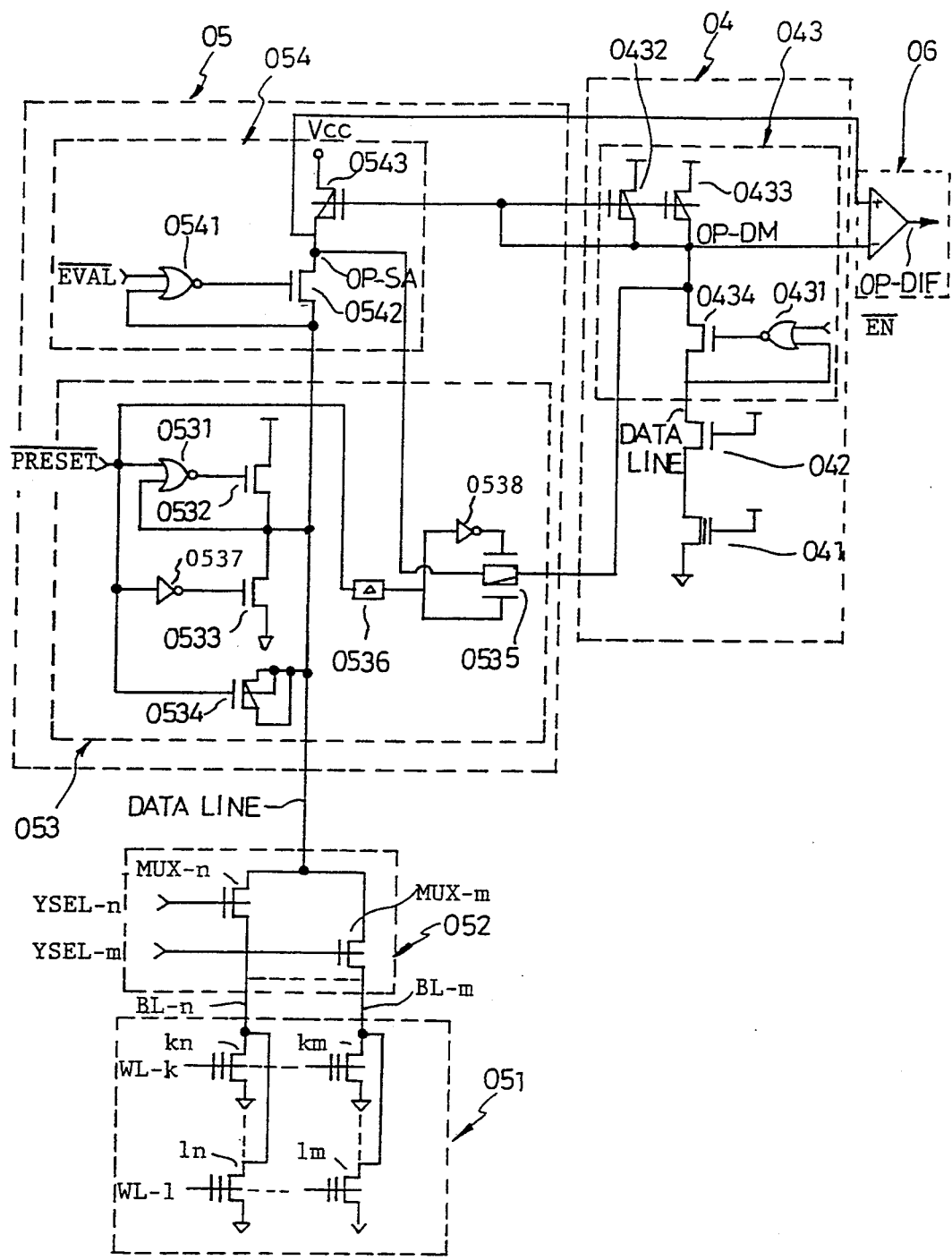
FIG. 2 shows a circuit of a preferred embodiment of a sense amplifier according to the present invention.

As shown in FIG. 2, a prefected embodiment of the present invention is depicted. The present sense amplifier includes a data sensing circuitry 05 including a presetting current detecting circuit 053 and an evaluating cement detecting circuit 054, a dummy cell circuitry 04 electrically connected to data sensing circuitry 05, and a differential amplifier 06 electrically connected to data sensing circuitry 05 and dummy cell circuitry 04.

More detailedly, the dummy cell circuitry 04 includes a dummy YMUX 042, a dummy on cell 041 whose gate is tied to Vcc and drain is electrically connected to dummy YMUX 042, and a current-voltage converting circuit 043 whose output node is electrically connected to one input of differential amplifier 06 and evaluating current detecting circuit 054. The current-voltage converting circuit 043 includes a third inverting device 0431 being a NOR gate, a third current switch 0434 being a NMOS and electrically connected to third inverting device 0431, a second load device being two diode-connected PMOS 0432, 0433 and parallelly electrically connected between Vcc and third current switch 0434. In addition, the presetting current detecting circuit 053 includes a first inverting device 0531 being a NOR gate, a first current switch 0532 being an NMOS and having a gate electrically connected to the output of first inverting device 0531, a NOT gate 0537 having an input electrically connected to one input of first inverting device 0531, a bleed device 0533 being a NMOS and having a drain electrically connected to the source of first current switch 0532, a compensating capacitor 0534 being a PMOS and having a gate electrically connected to the one input of first inverting device 0531, a delay device 0536 electrically connected to the one input of first inverting device 0531, an equalizing device 0535 being a CMOS transmission gate and having a source electrically connected to the output of delay device 0536, and a NOT gate 0538 having the input and the output thereof electrically connected to two sources of equalizing device 0535. Evaluating current detecting circuit 054 includes a second inverting device 0541 being a NOR gate, a second current switch 0542 being an NMOS and having a gate electrically connected to the output of second inverting device 0541, a first load device 0543 being a PMOS and having a source electrically connected to the drain of second current switch 0542.

As to the memory array 051 and the YMUX 052, because they are similar to the prior art, the details therefore are omitted. When one memory cell of the memory array 051 (i.e., the selected cell), e.g., the memory cell kin, is to be read, an X-decoder and a Y-decoder (not shown) will execute a decoding function for obtaining an address of the memory cell kin, and then enable word line WL-k and bit line BL-m respectively called selected WL and selected BL.

Figure 1:
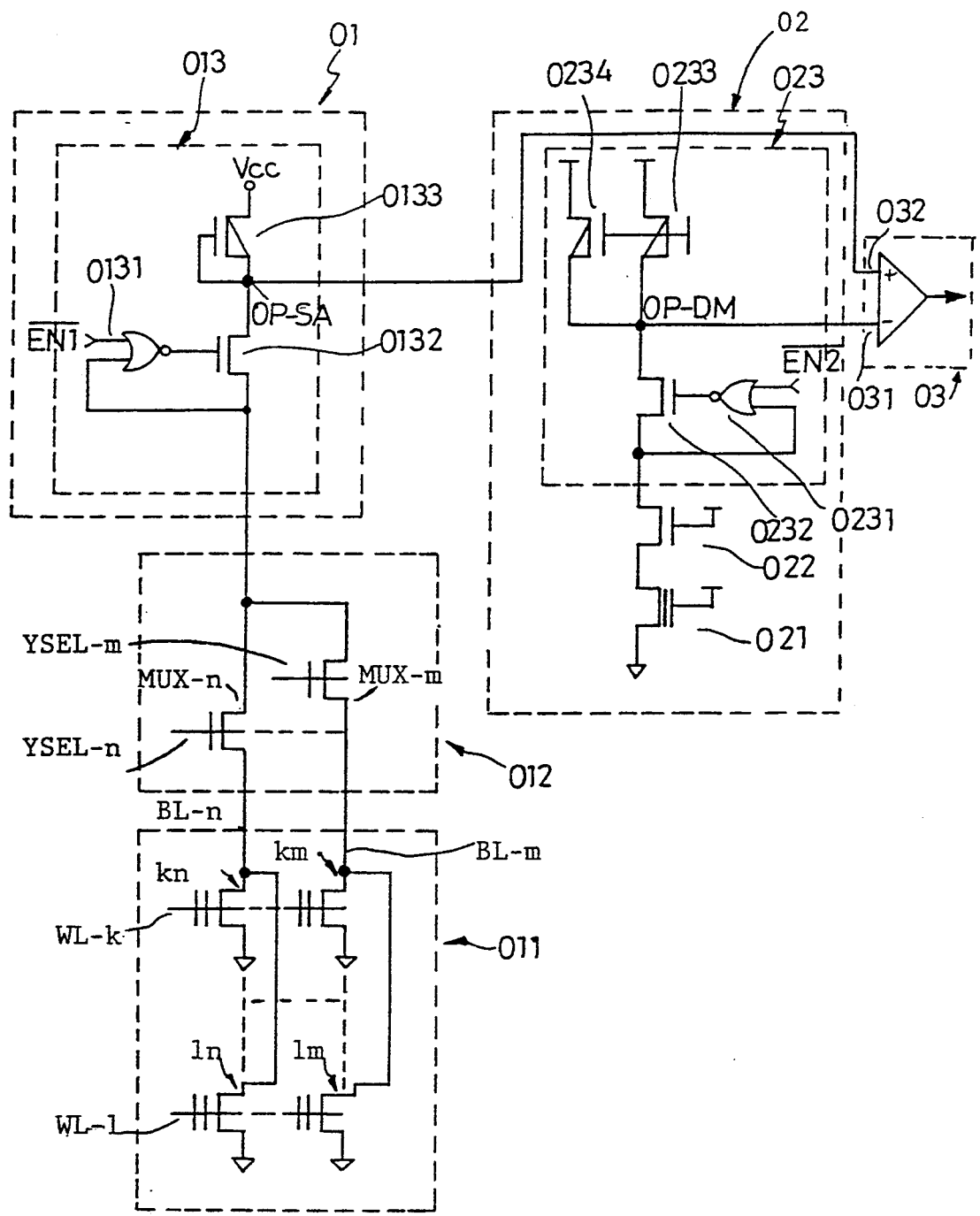
FIG. 1 shows a circuit of the conventional sense amplifier.

The function of the dummy cell circuitry 04 (as shown in FIG. 2) in the present sense amplifier is similar to that of the conventional dummy cell circuitry 02 (as shown in FIG. 1) in the conventional sense amplifier and is to provide a reference voltage for the output OP-DM of the dummy cell circuitry 04. The only difference is that the second load device 0432, 0433 and the first load device 0543 are connected to be a current mirror so that the voltage difference of the output OP-DM of the dummy cell circuitry 04 and the output OP-SA of the data sensing circuitry 05 can be enlarged and thus the sensing speed for the next stage (i.e., the differential amplifier 06) can be sped up. In addition, the voltage of the bit line is lowered (i.e., to be away from the switching voltage relatively farther) so that the noise margin of the bit line BL-m is larger and then the sensing result can be more stable.

The most important distinguishing feature of the present invention lies in that the sensing cycle includes a presetting phase and a evaluating phase. When the X-decoder (not shown) decodes an address of a selected word line (i.e., selected WL) of a selected memory cell and the Y-decoder (not shown) decodes an address of a selected bit line (i.e., a selected BL) of the selected memory cell, and by using a conventional ADT circuit (address transition detector circuit) (not shown), there is generated a low $\overline{PRESET}$ signal to NOR gate 0531, the present sense amplifier is in a presetting phase. When the presetting phase begins, if the voltage of the bit line BL-m is lower than the switching point, the positive voltage Vcc charges the bit line BL-m to a voltage approaching to the switch point; but if the voltage of the bit line BL-m is higher than the switching point, the negative voltage Vss discharges the bit line BL-m to a voltage approaching the switching point. In addition, before the presetting phase is over, the voltage of the bit line BL-m is preset to be around the switching point. At the time when the presetting phase is over, the NOR gate 0541 is input with a low $\overline{EVAL}$ signal to switch the present sense amplifier into an evaluating phase. Owing to the fact that before the evaluating phase begins, the voltage of the bit line BL-m has been set to be around the switching point, once the evaluating phase begins, the current of the selected cell km can be rapidly sensed. According to the sensed current, a specific voltage output at the output OP-SA is generated. After the voltage output at the output OP-SA and the reference voltage at the output OP-DM are input to the differential amplifier 06, the data in the selected cell km can be rapidly sensed.

Generally speaking, the word lines of the nonvolatile memory are of Poly-Si or policide, so there will be a relatively long delay time before we can get an output at the end of the word line from the X-decoder (not shown). By utilizing this delay time, when the present sense amplifier is just in the presetting phase, the voltage of the selected bit line BL-m is set to be around the switching point. Thus, during the evaluation phase, the present sense amplifier can have a faster sensing speed to fast sense the data.

The bleed device 0533 being a NMOS in the a presetting current detecting circuit 053 can, in the presetting phase, provide a discharging path to ground for the charges accumulatedly trapped in the selected bit line Bl-m due to the power noise, so that when the presetting phase is over, the voltage at the selected bit line BL-m can be maintained to be around the switching point in order that the data-sensing procedure will not be interfered by the extra charges generated by the power noise. For rapidly charging the voltage of the selected bit line BL-m to be around the switching point, the device size of the NMOS 0532 is larger than that of the NMOS 0542. Because the above-mentioned device size difference and the clock feed-through effect of the $\overline{PRESET}$ signal and the $\overline{EVAL}$ signal, the voltage at the bit line when the evaluating phase begins is lower than that when the presetting phase is to be over. For compensating this situation, the compensating capacitor 0534 being a PMOS (or an NMOS or a CMOS) can inject the charges stored in the PMOS 0534 into the selected bit line BL-m when $\overline{PRESET}$ signal goes high. By properly adjusting the size of the compensating capacitor 0534, the voltage decrease at the bit line BL-m owing to the size difference and the clock feed-through effect can be compensated.

In addition, for more rapidly sensing the data during the evaluation phase, there is an equalizing device 0535 being a CMOS transmission gate (or a PMOS transmission gate only or an NMOS transmission gate only) provided between the output OP-SA and the output OP-DM. The CMOS transmission gate 0535 is controlled by a signal generated from the $\overline{PRESET}$ signal.

By the delay device 0536, the PRESET signal is delayed for a period of time so that the voltage at the output OP-SA and the voltage at the output OP-DM are maintained to be equal for a small period of time after the presetting phase is over and the evaluating phase begins. In the case of "on" cell sensing, when the selected bit line BL-m is discharged to a voltage slightly lower than that when ½ Icell is achieved and the current in the PMOS 0543 is larger than ½ Icell, the equalizing device 0535 is switched to be off so that the next stage, i.e., the differential amplifier 06 can fast and correctly sense the data. As to the off cell, the situation is similar.

Figure 3A:
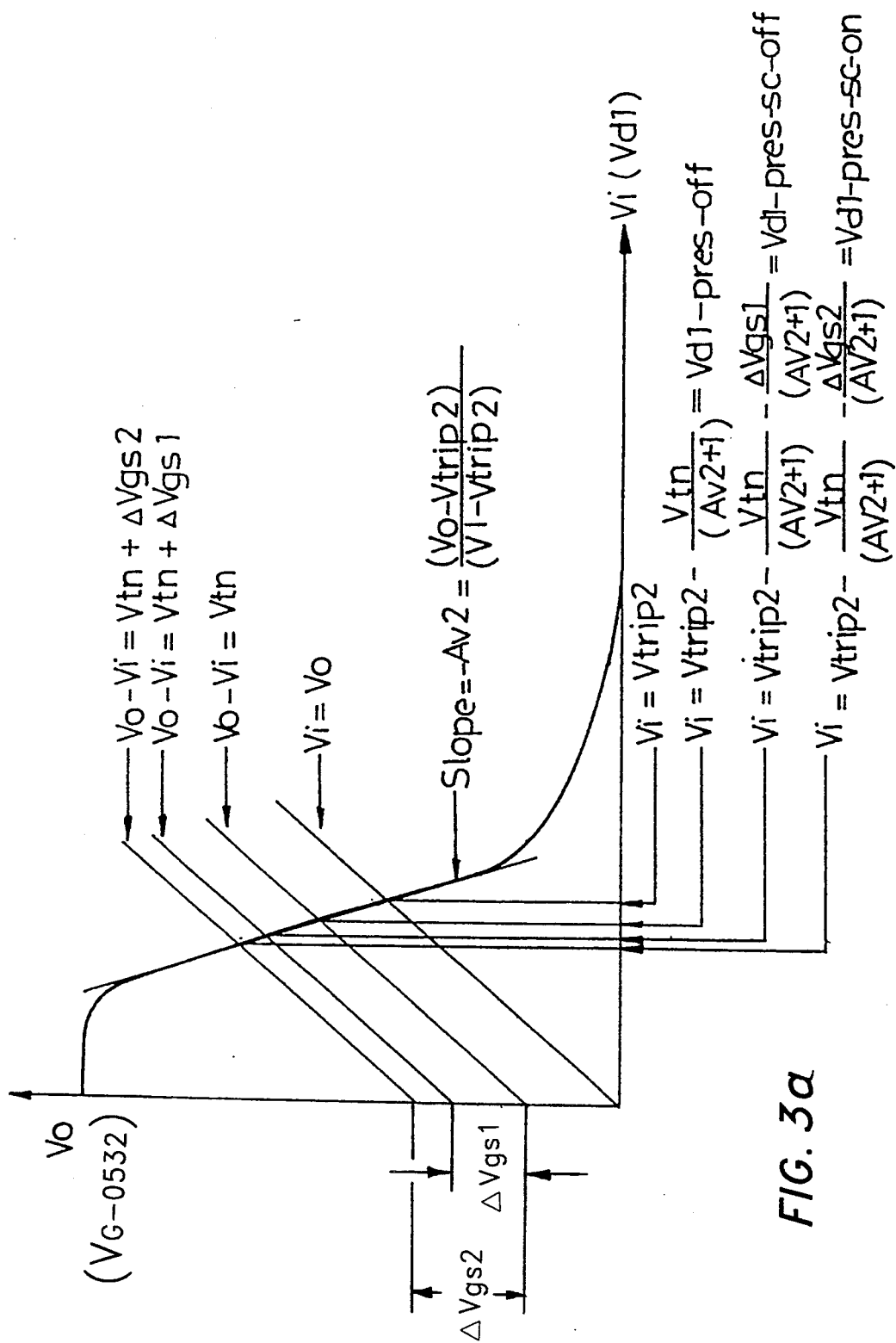
FIGS. 3(a) and 3(b) show DC analytical characteristic curves of two NOR gates of a sense amplifier according to the present invention.

The DC analysis of the present sense amplifier is hereinafter described: During the presetting phase, the current flows through the first current switch 0532 controlled by the NOR gate 0531 to the selected cell km and the bleed device 0533. Thus, for understanding the variation of the voltage at the selected bit line BL-m during the presetting phase, the DC operating voltage of the selected bit line BL-m with respect to the existence of the aforementioned components must be first analyzed. FIG. 3(a) shows the input-output characteristic curve of the NOR gate 0531, wherein Vi represents the input voltage of the NOR gate 0531 with respect to the ground GND (i.e., the voltage of the data line DL connecting the YMUX 052 and the presetting current detecting circuitry 053), and Vo represents the output voltage of the NOR gate 0531 with respect to the ground GND (i.e., the gate voltage of the first current switch 0532 with respect to the ground GND). The NOR gate 0531 is used as an inverting amplifier having an amplification factor-Av2 (i.e., the slope in the middle segment of the curve shown in FIG. 3(a)). The straight line equation defining the middle segment of the curve shown in FIG. 3(a) is represented by: (Vtrip2−Vo)=-(−Av2)*(Vtrip2−Vi), wherein Vtrip2 is the trip voltage of the NOR gate 0531 (when Vi=Vo=Vtrip2 or at where the line representing Vi =Vo intersects with the characteristic curve in FIG. 3(a)).

We first define Vdl-pres-off as the voltage of the data line DL when there is no current flowing through the current path (i.e., both the bleed device 0533 and the selected cell km are off) during the presetting phase; i.e., Vdl-pres-off occurs at where the line representing (Vo−Vi)=Vtn intersects with the characteristic curve shown in FIG. 3(a) (wherein Vtn is the threshold voltage of the current switch 0542).

When Vo−Vi=Vtn (i.e., the first current switch 0532 begins to be conducted), there is a very weak current flowing therethrough and Vgs of the first current switch 0532 is equal to Vtn thereof. We thus can obtain:

$$Vd1\text{-pres-off} = Vtrip2 - \frac{Vtn}{(Av2 + 1)} \tag{1}$$

Then Vdl-pres-sc-off is defined as the voltage of the data line DL when the bleed device 0533 is on but the selected cell km is off during the presetting phase. That is to say, Vdl-pres-sc-off occurs at where the line representing (Vo−Vi)=(Vtn+ΔVgs1) intersects with the characteristic curve, wherein ΔVgs1 represents the variation of Vgs of the first current switch 0532 due to the fact that the current Ibleed of the bleed device 0533 flows through the first current switch 0532, and can be approximately expressed by:

$$\Delta Vgs1 \approx \sqrt{\frac{2Ibleed}{Kn(W/L)_{0532}}}$$

Therefore, we can obtain:

$$\begin{aligned} Vd1\text{-}pres\text{-}sc\text{-}off &= Vtrip2 - \frac{Vtn}{Av2 + 1} - \frac{\Delta Vgs1}{Av2 + 1} \\ &= Vtrip2 - \frac{Vtn}{Av2 + 1} - \frac{\sqrt{\frac{2Ibleed}{Kn * W/L)_{0532}}}}{Av2 + 1} \end{aligned} \tag{2}$$

Now we define Vdl-pres-sc-on as the voltage of the data line DL when the bleed device 0533 is on and the selected cell km is completely on during the presetting phase. That is to say, Vdl-pres-sc-on occurs at where the line representing (Vo−Vi)=(Vtn+ΔVgs2) intersects with the characteristic curve, wherein ΔVgs2 represents the variation of Vgs of the first current switch 0532 due to the fact that the current Ibleed of the bleed device 0533 and the Icell flow through the first current switch 0532, and can be approximately expressed by:

$$V_{gs2} \approx \sqrt{\frac{2(I_{bleed} + I_{cell})}{K_n(W/L)_{0532}}}$$

So, we can obtain:

$$V_{dl\text{-}pres\text{-}sc\text{-}on} = V_{trip2} - \frac{V_{tn}}{Av2 + 1} - \frac{V_{gs2}}{AV2 + 1} \quad (3)$$

$$= V_{trip2} - \frac{V_{tn}}{Av2 + 1} - \frac{\sqrt{\frac{2(I_{bleed} + I_{cell})}{K_n(W/L)_{0532}}}}{Av2 + 1}$$

Figure 3B:
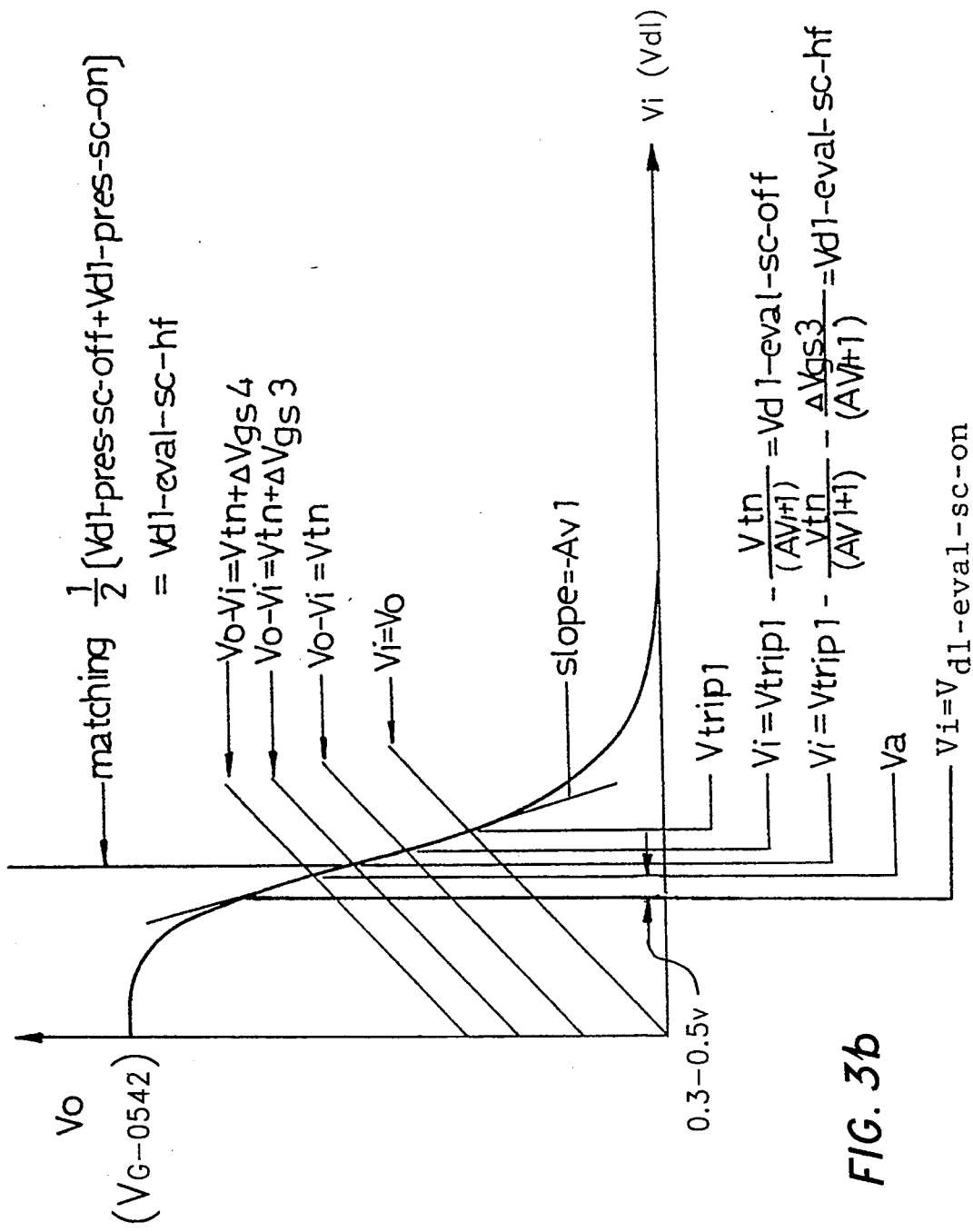

When the presetting phase is over, the evaluating phase begins and the evaluating current detecting circuit 054 including the NOR gate 0541, the second current switch 0542, and the first load device 0543 begins to work. How these components affect the DC operating point of the selected bit line BL-m will now be analyzed. FIG. 3(b) shows the input-output characteristic curve of the NOR gate 0541. The trip voltage of the NOR gate 0541 is defined as Vtrip1 (which occurs at where the line representing Vi=Vo intersecting with the characteristic curve shown in FIG. 3(b)) and the NOR gate 0541 is used as an inverting amplifier having an amplification factor −Av1.

We define Vdl-eval-sc-off as the voltage of the data line DL when there is no current flowing through the current path (i.e., the selected cell km is an off cell or the selected word line WL-k is off) during the evaluating phase; i.e., Vdl-eval-sc-off occurs at where the line representing (Vo−Vi)=Vtn intersects with the characteristic curve in FIG. 3(b).

When the selected cell is an off cell, the data line DL is charged to the voltage that makes the second current switch 0542 to be off and at this moment $$V_{dl\text{-}eval\text{-}sc\text{-}off} = V_{trip1} - \frac{V_{tn}}{Av1 + 1} \quad (4)$$

Then Vdl-eval-sc-on is defined as the voltage of the data line DL when the selected on cell is completely on during the evaluating phase.

The gate of the first load device 0543 is biased to be at the reference voltage, i.e., the first load device 0543 can at the most provide a current slightly larger than ½ Icell owing to the channel length modulation effect. When the current in the on cell is larger than ½ Icell, the on cell will discharge the selected bit line Bl-m to so have a certain relatively lower voltage that the current in the on cell will equal to the current in the first load device 0543. Meanwhile, the voltage drop of YMUX makes the data line DL to have a slightly higher voltage than the voltage of the selected bit line BL-m to force the second current switch 0542 to be in the linear region and the voltage at the output OP-SA will thus be lowered to be around the voltage of the data line DL (or bit line). This method causing the load devices 0432, 0433, 0543 to form a current mirror has an advantage, i.e. the voltage difference of the outputs OP-SA and OP-DM will be enlarged so that the sensing speed of the next stage, i.e., the differential amplifier 06 will be sped up and the bit line voltage will be lowered (i.e., to be more distant from the switching point). Therefore, the noise margin of the bit line will be enlarged, and the sensing stability will be increased. Because the present sense amplifier is of dynamic sensing, the next sensing time will not be affected no matter how low the present voltage of the bit line is. For easily analyzing Vdl-eval-sc-on, we assume that the first load device 0543 can provide Icell for the second current switch 0542, and has a voltage Va:

$$V_a = V_{trip1} - \frac{V_{tn}}{Av1 + 1} - \frac{\sqrt{\frac{2I_{cell}}{K_n(W/L)_{0542}}}}{Av1 + 1} \quad (5)$$

$$= V_{trip1} - \frac{V_{tn}}{Av1 + 1} - \frac{\Delta V_{gs4}}{Av1 + 1}$$

In fact, Vdl-eval-sc-on is at a certain voltage lower than Va. In other words. Vdl-eval-sc-on=Va−ΔV wherein ΔV 0.3 V−0.5 V.

Now we define Vdl-eval-sc-hf as the voltage of the data line DL when the current in the current path equals to ½ Icell in the evaluating phase. When the current in the current path equals to ½ Icell, the voltage at the output OP-SA of the evaluating current detecting circuit 054 equals to the voltage at the output OP-DM of the dummy cell circuitry 04. That, is, the correct data are to be sensed, and under this situation, the bit line voltage is at the switching point. Thus, we can obtain:

$$V_{dl\text{-}eval\text{-}sc\text{-}hf} = V_{trip1} - \frac{V_{tn}}{Av1 + 1} - \frac{\sqrt{\frac{I_{cell}}{K_n(W/L)_{0542}}}}{Av1 + 1} \quad (6)$$

$$= V_{trip1} - \frac{V_{tn}}{Av1 + 1} - \frac{\Delta V_{gs3}}{Av1 + 1}$$

In addition, the voltage of the switching point can be represented as: Vbl-switch=Vdl-eval-sc-hf-½*(Icell * Rymux) wherein Rymux is the resistance of the MUX-m in the YMUX 052. Because the resistance of MUX-m is relatively small (i.e. 200Ω−500Ω, the voltage variation of the data line DL approximately equals to that of the bit line.

Now we define the device sizes of the aforementioned components in view of the above analyses and the following considerations.

1) The device size of the second current switch 0542:

For obtaining a better noise immunity (to free the data from being incorrectly sensed owing to the bit line voltage variation resulting from the power noise), the noise margin of the data line is set larger than 100 mV (but it is to be noticed that the larger the noise margin is, the longer the sensing time is), i.e., both (Vdl-eval-sc-hf-Vdl-eval-sc-on) and (Vdl-eval-sc-off- Vdl-eval-sc-hf) are larger than 100 mV. By equation (6), (5), and (4), we can find the relation among Icell, Av1 and (W/L)$_{0542}$. If Icell and Av1 are decided, then (W/L)$_{0542}$ can be determined. Generally speaking, Icell is decided by the width and length of the memory cell, and Av1 is decided by the inner device length of the NOR gate.

2) The device size of the bleed device 0533:

Even when there is a charge-trapping phenomenon in the bit line ( or the data line), the voltage of the bleed device is at most larger than the switching point by about 0.2 V to about 0.3 V. So, the device size of the bleed device is about two times to about 5 times larger than that of the memory cell in order that before the presetting phase is over, the voltage at the data line (or the bit line) can be pulled back to be around the switching point.

3) The device size of the first current switch 0532:

By equation (2) and equation (3), we can inspect that the larger $(W/L)_{0532}$ is, the closer Vdl-pres-sc-on and Vdl-pres-sc-off will be. During the presetting phase, no matter whether selected cell is an off cell or an on cell, by properly deciding the device size of $(W/L)_{0532}$, the voltage of the data line can be set to be very close to the switching point (usually by less than 10 mV). If the device size of the first current switch 0532 is too large, owing to its parasitic capacitance effect which affects the data line, the charging time or the discharging time of the bit line is delayed so that the value of $(W/L)_{0532}$ cannot be set too large.

4) The device size of the NOR gate 0541:

The trip voltage of the NOR gate 0541 determines the voltage on which the bit line is clamped. For avoiding the soft programming (e.g. in the EPROM or flash memory), Vtrip1 is set to range from about 1.2 V to about 1.5 V.

5) The device size of the NOR gate 0531:

Because the device sizes of the NOR gate 0531 and the NOR gate 0541 are close, and the layout and the arranging manner of the transistors of them are also the same, the value of Av1 will be very close to Av2, i.e., Av1≈Av2.

According to the present invention, since during the presetting phase, the voltage of the data line is charged (or discharged) to a certain voltage, and when the presetting phase is switched into the evaluating phase, the certain voltage is equivalent to the voltage (i.e., Vdl-eval-sc-hf) of the data line when the current flowing through the current path is ½ Icell, during the presetting phase, we can design:

$$Vdl\text{-}pres = 1/2*[Vdl\text{-}pres\text{-}sc\text{-}off + Vdl\text{-}pres\text{-}sc\text{-}on] \quad (7)$$
$$= Vdl\text{-}eval\text{-}sc\text{-}hf$$
$$\approx Vdl\text{-}pres\text{-}sc\text{-}off$$
$$\approx Vdl\text{-}pres\text{-}sc\text{-}on$$

By equation (7) and Ibleed, Icell, and Vtrip1, we can easily decide Vtrip2 and obtain a very accurate voltage difference between Vtrip1 and Vtrip2 by a circuit simulating means such as HSPICE. Meanwhile, the device sizes of the MOSFETs in the NOR gate 0531 and the NOR gate 0541 can also be determined. In fact, Vtrip1 and Vtrip2 are very close, so the layouts of the NOR gate 0531 and the NOR gate 0541 can be so made that there are only two corresponding MOSFETs, respectively in NOR gates 0531 & 0541, whose device sizes are different based on circuit simulation and that the other MOSFETs in NOR gates 0531 are kept identical in size and layout manner to the corresponding MOSFETs in NOR gate 0541. In addition, the NOR gate 0531 and the NOR gate 0541 are layouted to be adjacent and electrically connected to the same positive power Vcc and the negative power Vss. Even when the manufacturing process deviation occurs or the noise resulting from the Vcc or the Vss happens, the voltage variation of Vtrip1 and Vtrip2 can be held identical.

6) The device size of the NOR gate 0431:

The NOR gate 0431 is used to clamp the voltage of the data line of the dummy cell circuitry 043 in order to keep the operating point of the dummy cell 043 to be close to that of the selected cell and to keep the current in the dummy cell 041 equals to Icell. Thus, if the NOR gate 0431 is designed to be identical to the NOR gate 0541, the layout, the device size and the connected node of the power supply of the NOR gate 0431 will be the same as those of the NOR gate 054 1.

7) The device size of the third current switch 0434:

Because of the same reason described in the preceding paragraph, the device size of the current switch 0434 is the same as that of the second current switch 0542.

8) The device size of the second load device 0432, 0433:

The load device 0432, 0433 includes two identical PMOS connected in parallel each of which has a size the same as that of the first load device 0543. In addition, the gate of the second load device 0432, 0433 is electrically connected to the gate of the PMOS 0543 for ensuring that during the evaluating phase and when the voltage at the output OP-SA equals to the voltage at the output OP-DM, the current flowing through the first current switch 0542 is about ½ Icell so that regardless of whether an on cell or an off cell is concerned, there is a satisfying current sensing margin.

Figure 4:
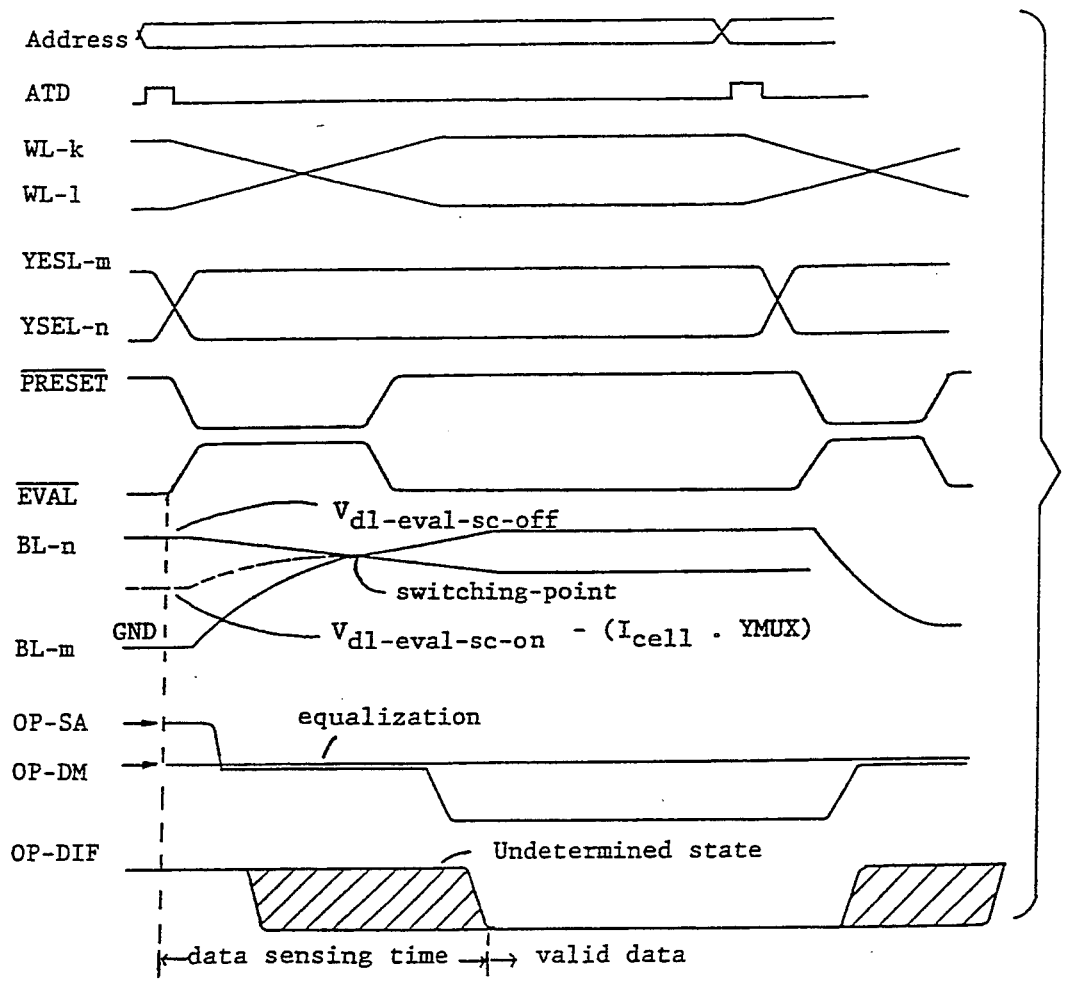
FIG. 4 shows the related waveforms of a sense amplifier according to the present invention.

FIG. 4 shows the related waveforms according to the present invention. The control signal ATD is a short pulse signal generated by a conventional ATD circuit when the selected address changes. This pulse signal triggers a clock-generating circuit to obtain a negative PRESET pulse signal, and switches to low nearly at the same time when the output of the X-decoder or the Y-decoder changes. Owing to the fact that the word line of the nonvolatile memory is made of poly-Si or policide, the end of the word line with respect to the X-decoder has a relatively long output delay. Even if the word line is made of the policide, its RC time constant might be up to above 30 ns. Whereas, the output of the Y-decoder and the YMUX 052 are electrically connected by a metal line, so as long as the output of the Y-decoder is active, the transmission gate connecting the endmost transmission gate YSEL-m or YSEL-n will be on within about 3 ns to about 5 ns. Therefore, during the time period difference between WL delay and YSEL delay, this invention is designed to initiate the presetting phase almost at the same time when the addressed X-decoder is active and the selected bit line is charged or discharged through the rapidly turned-on YMUX so that the data can be rapidly sensed during the evaluating phase to fasten the sensing time. This is due to the fact described as follows:

For shortening the sensing time, the Vtrip2 of the NOR gate 0531 can be set to be higher than that discussed previously by 20 mV. In the design of the nonvolatile memory, for avoiding the interference of the floating deselected bit line to the sensing of the memory cell, the deselected bit line is discharged to a reference voltage lower than the selected bit line voltage, e.g., the GND voltage, and then the selected bit line is charged through the reference voltage (e.g., the GND voltage). After the presetting phase begins, the time required for the GND voltage to exponentially charge the selected bit line to Vdl-pres is decided by the sum of the metal resistance of the bit line and the resistance of the YMUX (i.e., the equivalent resistance Reft=(Rymux+Rbl)) multiplied by the sum of the capacitance of the bit line and the data line, i.e., the equivalent capacitance Ceff =(Cb1+Cd1)). Generally speaking, the time during which the bit line is charged by the GND voltage to a voltage away from the typical 1.5 V of Vdl-pres for about 10 mV is about 5* Reft*Ceff. In another situation, if the bit line is not changed, and the word line is changed from the previous selected off cell to the new selected on cell, the time period during which the voltage difference (smaller than 300 mV) is generated from the time the voltage of the data line is Vdl-eval-sc-off (when the presetting phase begins) to the time the data line voltage is discharged to Vdl-pres is decided by the bleed device 0533 and is usually much smaller than 5 * Reft * Ceff. Taking a 4M EPROM (having Icell=100 μA, Ibleed=400 μA, Rymux=300Ω, Cbl=6P, and Cdl=2P) for example, 5*Reff*Ceff is about 25 ns and the discharging time period is about 10 ns. Thus, for avoiding the fact that the presetting phase is too long so that the sensing time also becomes too long, the time for the presetting phase can be designed as 4*Reft *Ceff and the expected final voltage during the presetting phase is designed higher than Vdl-pres by about 20 mV in order that within the shorter presetting phase, the data line can be first charged to a voltage higher than Vdl-eval-sc-hf by about 20 mV, and so far as the discharging situation is concerned, there will not be very, much evaluating time to be lost.

Because the device sizes of the two current switches 0532, 0542 are relatively different, upon the presetting phase being switched into the evaluating phase, Vgs of the first current switch 0532 changes from Vtn to -(Vdl-pres). Due to the clock feed-through effect, there are a relatively large amount of charges (i.e., $\beta$* Cgs$_{0532}$* (Vtn+Vdl-pres), wherein $\beta$ is a numerical factor which is about ½ here) moved out the data line. By the same token, there are a relatively small amount of charges (i.e., $\beta$* (Vtn+Vdl-pres+$\Delta$Vgs$_{0542}$) * Cgs$_{0542}$) moved into the data line. Because the amount of the above-mentioned charges are not equal, the data line voltage when the evaluating phase begins is lower than that when the presetting voltage ends. For compensating this situation, the present invention has a PMOS capacitor 0534 by the control of the $\overline{\text{PRESET}}$ signal. By properly adjusting the size of the PMOS capacitor 0534, when the $\overline{\text{PRESET}}$ signal is to be high, the data line (or bit line) is charged with stored charges to compensate the clock feed-through effect produced by the current switches 0532, 0542. But when the evaluating phase is switched into the next presetting phase, the data line voltage will be preset to a desired value (without the necessity of considering the clock feed-through effect) before the presetting phase ends.

For more rapidly sensing the data during the evaluating phase, the present invention can have an equalizing device 0535, whose gate is controlled by a signal resulting from the $\overline{\text{PRESET}}$ signal with a proper delay, mounted between outputs OP-SA and OP-DM. That is to say, for the selected on cell sensing case, after the presetting phase is over, the equalizing device 0535 maintains the outputs OP-SA and OP-DM to have the same voltage level. After the evaluating phase has begun for a small period of time, the data line voltage will be over Vdl-eval-sc-hf to ensure that the current in the first load 0543 is larger than ½ Icell and then to allow the equalizing device 0535 to be off, so that the next stage (i.e., the differential amplifier 06) can rapidly and correctly sense the data. Likewise, the equalizing device 0535 plays the same role in the selected off cell sensing case as it is in the on cell sensing case.

While the present invention has been described in connection with what is presently considered to be the most practical and preferred embodiment, it is to be understood that the invention is not to be limited to the disclosed embodiment but on the contrary, is intended to cover various modifications and equivalent arrangements included within the spirit and scope of the appended claims whose scope is to be accorded the broadest interpretation so as to encompass all such modifications and equivalent structures.

What is claimed is:

1. A two-phase sense amplifier adapted to be used for sensing data of a memory array which includes plural memory cells, wherein drains of said memory cells in a column are electrically connected to a bit line and gates of said memory cells in a row are electrically connected to a word line, and wherein said memory array is electrically connected to an X-decoder and a Y-decoder which are utilized to obtain an address of a selected one of said memory cells in said memory array, comprising:
   a data sensing circuitry including:
      a presetting current detecting circuit for allowing said sense amplifier to be in a presetting phase when said X-decoder decodes an address of a selected word line of said selected memory cell and said Y-decoder decodes an address of a selected bit line of said selected memory cell, and then for setting a voltage level of said selected bit line to be around a switching point; and
      an evaluating current detecting circuit for allowing said sense amplifier to be in an evaluating phase after said voltage level of said selected bit line is around said switching point in order to sense a current in said selected cell for convening said current into a voltage output;
   a dummy cell circuitry electrically connected to said data sensing circuitry for providing a reference voltage to said data sensing circuitry; and
   a differential amplifier electrically connected to said data sensing circuitry and said dummy cell circuitry for accepting and comparing said voltage output of said data sensing circuitry and said reference voltage of said dummy cell circuitry to sense data of said selected memory cell.

2. A sense amplifier according to claim 1, wherein said dummy cell circuitry includes:
   a dummy YMUX;
   a dummy cell electrically connected to said dummy YMUX, wherein said dummy cell is biased with an operating point near to that of said selected cell in order to make sure that a dummy cell current and said current of said selected cell are substantially the same; and
   a current-voltage converting circuit electrically connected to said differential amplifier and said evaluating current detecting circuit for converting said dummy cell current into said reference voltage of said dummy cell circuitry.

3. A sense amplifier according to claim 2, wherein said current-voltage converting circuitry includes:
   a third inverting device having an input coupled to an EN input signal and another input, for enabling said dummy cell circuitry and for providing an amplifying effect;
   a third current switch having one terminal electrically connected to said another input of said third inverting device and a gate electrically connected to and controlled by an output of said third inverting device; and
   a second load device having a drain electrically connected to one terminal said third inverting device for converting said dummy cell current into said reference voltage of said dummy cell circuitry.

4. A sense amplifier according to claim 3, wherein said third inverting device is a NOR gate.

5. A sense amplifier according to claim 3, wherein said third current switch is an NMOS.

6. A sense amplifier according to claim 3, wherein said second load device includes two PMOS.

7. A sense amplifier according to claim 3, wherein said presetting current detecting circuit includes:
 a first inverting device for accepting a low PRESET signal to allow said sense amplifier in said presetting phase and to provide an amplifying effect; and
 a first current switch electrically connected to and controlled by said first inverting device.

8. A sense amplifier according to claim 7, wherein said first inverting device is a NOR gate.

9. A sense amplifier according to claim 7, wherein said first current switch is an NMOS.

10. A sense amplifier according to claim 7, wherein said evaluating current detecting circuit further includes:
 a NOT gate electrically connected to said first inverting device; and
 a bleed device electrically connected to said first current switch for providing a discharging path to ground for charges trapped in said selected bit line.

11. A sense amplifier according to claim 10, wherein said bleed device is an NMOS.

12. A sense amplifier according to claim 10, wherein said bleed device has a size being from about two times to about five times that of any one of said memory cells.

13. A sense amplifier according to claim 7, wherein said presetting current detecting circuit further includes a compensating capacitor electrically connected to said first inverting device for compensating a clock feedthrough effect thereof in order to maintain said voltage level of said selected bit line to be around said switching point both just before and after an onset of said evaluating phase.

14. A sense amplifier according to claim 13, wherein said compensating capacitor is a PMOS capacitor.

15. A sense amplifier according to claim 13, wherein said compensating capacitor is an NMOS capacitor.

16. A sense amplifier according to claim 13, wherein said presetting current detecting circuit further includes a delay device having an input electrically connected to an input of said first inverting device and an equalizing device having a terminal electrically connected to an output of said delay device for maintaining said voltage output of said data sensing circuitry and said reference voltage of said dummy cell circuitry to be equal for a certain period of time after said presetting phase is over.

17. A sense amplifier according to claim 16, wherein said equalizing device is a CMOS transmission gate.

18. A sense amplifier according to claim 16, wherein said equalizing device is a PMOS transmission gate.

19. A sense amplifier according to claim 16, wherein said equalizing device is an NMOS transmission gate.

20. A sense amplifier according to claim 7, wherein said evaluating current detecting circuit includes:
 a second inverting device for accepting a low $\overline{\text{EVAL}}$ signal to actuate said sense amplifier to be in said evaluating phase and to for provide an amplifying effect; a second current switch electrically connected to and controlled by said second inverting device; and
 a first load device electrically connected to said second inverting device for sensing said voltage output according to said current in said selected cell.

21. A sense amplifier according to claim 20, wherein said second inverting device is a NOR gate.

22. A sense amplifier according to claim 20, wherein said first inverting device, said second inverting device, said third inverting device have relatively close device sizes.

23. A sense amplifier according to claim 20, wherein said first inverting device and said second inverting device have substantially the same voltage gain.

24. A sense amplifier according to claim 20, wherein said second current switch and said third current switch have relatively close device sizes.

25. A sense amplifier according to claim 20, wherein said second inverting device has a trip voltage ranging from about 1.2 V to about 1.5 V.

26. A sense amplifier according to claim 20, wherein said first load device and second load device have relatively close device sizes.

27. A sense amplifier according to claim 1, wherein said switching point means a voltage value of said selected bit line when said voltage output equals to said reference voltage.

* * * * *

UNITED STATES PATENT AND TRADEMARK OFFICE
CERTIFICATE OF CORRECTION

PATENT NO. : 5,396,467
DATED : March 7, 1995
INVENTOR(S) : Ding-Jen Liu; Jyh-Jer Cho It is certified that error appears in the above-indentified patent and that said Letters Patent is hereby corrected as shown below:

In Claim 1, column 14, line 29, change the word "convening" to "converting".

Signed and Sealed this

Ninth Day of September, 1997

Attest:

BRUCE LEHMAN

Attesting Officer      Commissioner of Patents and Trademarks